United States Patent [19]
Tung

[11] Patent Number: 5,976,922
[45] Date of Patent: Nov. 2, 1999

[54] METHOD FOR FABRICATING A HIGH BIAS DEVICE COMPATIBLE WITH A LOW BIAS DEVICE

[75] Inventor: Ming-Tsung Tung, Hsinchu Hsien, Taiwan

[73] Assignee: United Microelectronics Corp., Hsinchu, Taiwan

[21] Appl. No.: 09/200,895

[22] Filed: Nov. 27, 1998

[51] Int. Cl.[6] .............................................. H01L 21/8238
[52] U.S. Cl. ......................................... 438/228; 438/232
[58] Field of Search ................................... 438/205, 223, 438/224, 225, 227, 228, 232, 262, 263, 264, 283, 301, 305, 306, 307, 373, 374, 514, 519, 521

[56] References Cited

U.S. PATENT DOCUMENTS

| | | | |
|---|---|---|---|
| 5,047,358 | 9/1991 | Kosiak et al. | 438/228 |
| 5,486,482 | 1/1996 | Yang | 438/227 |
| 5,550,064 | 8/1996 | Yang | 438/227 |

*Primary Examiner*—Charles Bowers
*Assistant Examiner*—Jack Chen
*Attorney, Agent, or Firm*—Oblon, Spivak, McClelland, Maier & Neustadt, P.C.

[57] ABSTRACT

A method for fabricating a high-bias device compatible with a low-bias device is provided. The method of the invention includes using a doped well as a drift region of the high-bias device so that the drift region can be formed simultaneously when a well for a low-bias device is formed. The method of the invention also fabricates the high-bias device and the low-bias device simultaneously, using a commonly used photomask. Several ion implantation processes are also performed simultaneously. There is no need of some extra fabrication of photomasks and ion implantation processes separately used for forming the high-bias device.

18 Claims, 6 Drawing Sheets

METHOD FOR FABRICATING A HIGH BIAS DEVICE COMPATIBLE WITH A LOW BIAS DEVICE

BACKGROUND OF THE INVENTION

1. Field of the Invention

This invention relates to semiconductor fabrication, and more particularly to a method for fabricating a high bias device, using a doped well as a drift region of the high-bias semiconductor device.

2. Description of Related Art

As the size of semiconductor device is reduced, the channel length is accordingly reduced resulting in a semiconductor device with a faster operational speed. However, even though the shorter channel length raises the operational speed, a channel length that is too short creates other serious problems. These problems are generally called the short channel effect and are described as follows. If the bias applied on the semiconductor device is kept constant but the channel length is shortened, according to a formula of "electric field (E-field)=bias/channel length", where E-field is measured in units of "V/m", the electrons within the channel gain more energy due to the stronger E-field so that the possibility of an electrical breakdown is higher.

For example, it is quite common for current electronic products, such as a digital versatile disk (DVD) or a liquid crystal display (LCD), to be driven by high bias. A circuit device for driving the DVD and the LCD needs a high bias tolerance of about 12–30 volts. In general, a high-bias semiconductor device mainly utilizes an isolating layer 0 volts. In general, a high-bias semiconductor device mainly utilizes an isolating layer and a drift region under the isolating layer to increase the distance between an interchangeable source/drain and a gate. So, the high-bias semiconductor device can normally work with a high-bias power source.

FIGS. 1A–1D are cross-section views of a high-bias semiconductor device schematically illustrating a conventional fabrication process for a high-bias semiconductor device. In FIG. 1A, a semiconductor substrate doped with a first-type dopant is provided (not shown). Then, a well 10 doped with a second-type dopant is formed on the substrate. If the first-type dopant is N-type then the second-type dopant is P-type, and if the first-type dopant is P-type then the second-type dopant is N-type. The P-type dopant is, for example, boron or gallium, and the N-type dopant is, for example, arsenic or phosphorus. Next, a thermal process is performed on the well 10 to form a pad oxide layer 20 over the well 10. A low chemical vapor deposition (LPCVD) process is performed to form a silicon nitride layer 30 over the pad oxide layer 20.

In FIG. 1A and FIG. 1B, a portion of the silicon nitride layer 30 is removed by photolithography and etching to expose the pad oxide layer 20. The silicon nitride layer 30 becomes a silicon nitride 50, on which a photoresist layer 40 remains. An ion implantation is performed to implant the exposed region of the pad oxide layer 20. A drift region 60 then is formed. The drift region 60 includes, for example, the first type of dopant, gallium.

In FIG. 1C, the photoresist layer 40 is removed. A wet oxidation process is performed by using the silicon nitride layer 50 as a mask to form a field oxide layer 70 above the drift region 60. A bird's beak structure, or an acute structure, occurs on each end of the silicon nitride layer 50. The bird's beak structure is due to a high temperature from the wet oxidation process. The high-temperature environment drives the implanted ions inside the drift region 60 into the well 10 and forms the field oxide layer 70 above the drive region 60, where the field oxide layer 70 is not masked by the silicon nitride layer 50. The field oxide layer 70 pushes each end of the silicon nitride layer 50 to form the bird's beak structure.

In FIG. 1C and FIG. 1D, a wet etching process is performed to remove the silicon nitride layer 50 and the pad oxide layer 20 shown in FIG. 1B so that the well 10 is exposed. Then, a dry oxidation process is performed to form a gate oxide layer 80 over the well 10 and the field oxide layer 70. A gate layer 90 including, for example, polysilicon is formed over the gate oxide layer 80 by, for example, deposition. A portion of the gate oxide layer 80 and the gate layer 90 is removed by photolithography and etching, in which a region of the field oxide layer 70 and the well 10 is exposed. Then an ion implantation process with a high density but low energy condition is performed to implant the first-type dopant into the well 10 on the exposed region. The drift region 60, after implantation, becomes a drift region 100 below the exposed region. A first-type dopant with high density and low energy is doped onto the exposed region of the well 10 on each side of the gate layer 90 to form a source region 110 and a drain region 120.

The conventional high-bias device shown in FIG. 1D needs several photomasks to obtain the desired structure. The high-bias device is separately fabricated in order to serve as an interface to drive other 1C device driven by high bias, such as the DVD or the LCD. In conclusion, this conventional method for fabricating the high-bias device consumes much time and cost for the fabrication of the photomasks. The throughput is also affected.

SUMMARY OF THE INVENTION

It is therefore an objective of the present invention to provide a method for fabricating a high-bias device, of which the fabrication process is compatible with a low-bias device so that less photomasks are needed and fabrication cycle time is reduced.

In accordance with the foregoing and other objectives of the present invention, a method for fabricating a high-bias device compatible with a fabrication process of a low-bias device is provided. The method of the invention includes using a doped well as a drift region of the high-bias device so that the drift region can be formed simultaneously when a well for a low-bias device is formed. The method of the invention also fabricates the high-bias device and the low-bias device simultaneously, using a commonly used photomask. There is no need of some extra fabrication of photomasks separately used for forming the high-bias device.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

In the invention, a high-bias device is compatibly formed with a low-bias device. There is no need of some extra photomasks separately used for forming the high-bias device and the low-bias device. The fabrication cost and the fabrication cycle time are reduced.

Figure 2A:
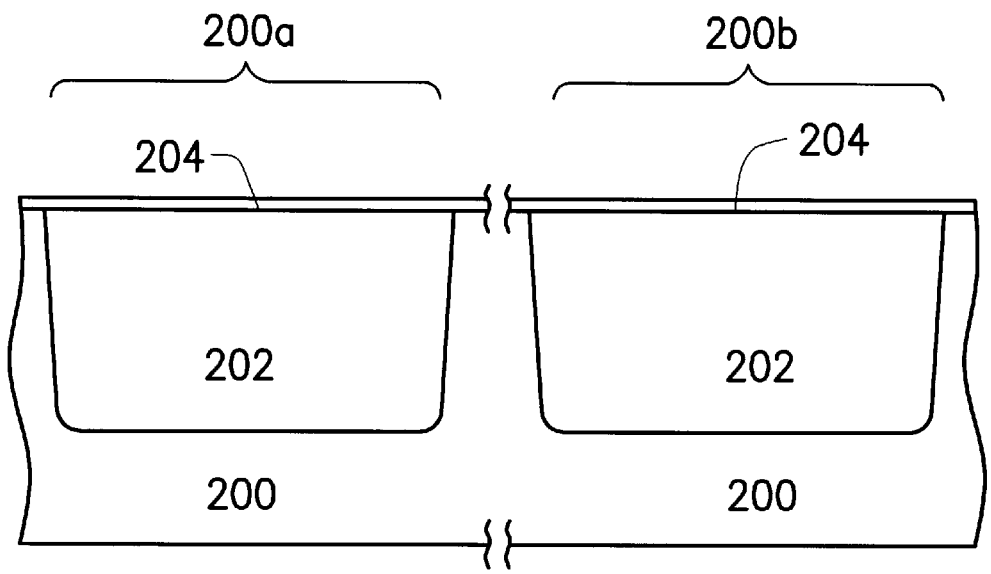
FIGS. 2A–2G are cross-sectional views of a high-bias semiconductor device schematically illustrating a fabrication process for the high-bias semiconductor device, according to preferred embodiment of the invention.

FIGS. 2A–2G are cross-sectional views of a high-bias semiconductor device schematically illustrating a fabrication process for the high-bias semiconductor device, according to preferred embodiment of the invention. In FIG. 2A, a semiconductor substrate 200 doped with a first-type dopant is provided. An oxide layer 204 is formed on the substrate 200 by for example, thermal oxidation. The substrate 200 includes a high-bias region 200a and a low-bias region 200b. A well 202 doped with a second-type dopant is formed in the substrate 200 separately at the high-bias region 200a and at the low-bias region 200b. The well 202 is formed by, for example, photolithography and ion implantation, and a driving-in process, such as a thermal process preferably with a high temperature, is also included. If the first-type dopant is P-type then the second-type dopant is N-type. The P-type dopant is, for example, boron or gallium, and the N-type dopant is, for example, arsenic or phosphorus.

Figure 2B:
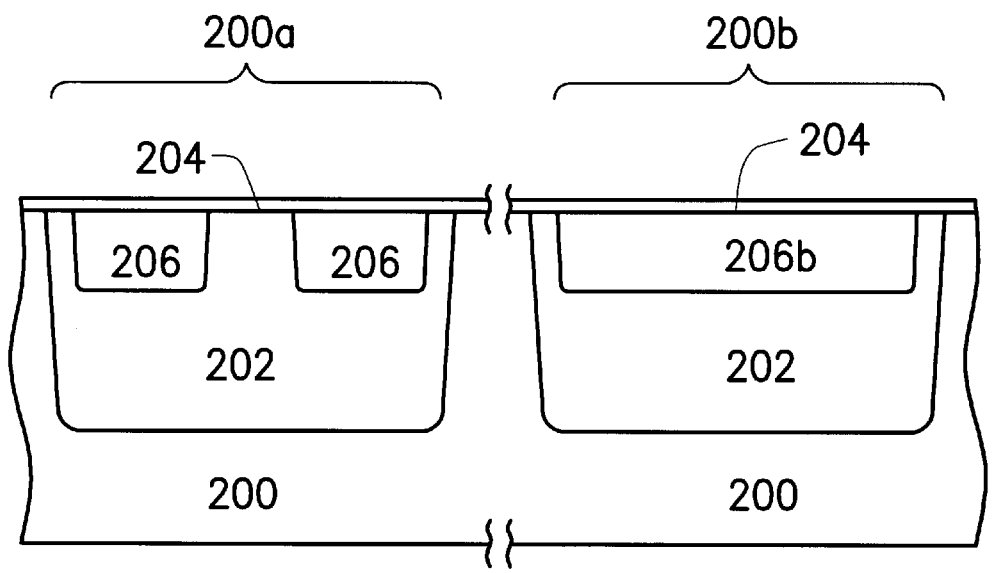

In FIG. 2B, using photolithography and ion implantation, two wells 206 in the well 202 at the high-bias region 200a and one well 206b in the well 202 at the low-bias region 200b are formed. The formation of the wells 206, 206b includes, for example, photolithography and ion implantation, and a driving-in process, such as a thermal process preferably with a high temperature, is performed to drive-in the implanted dopants. The doped dopant is the first-type dopant. The wells 206 serve as a drift region for an interchangeable source/drain region of a high-bias metal-oxide semiconductor (MOS) transistor, which is to be formed. The well 206b serves as a typical well for forming a low-bias MOS transistor on it.

Figure 2C:
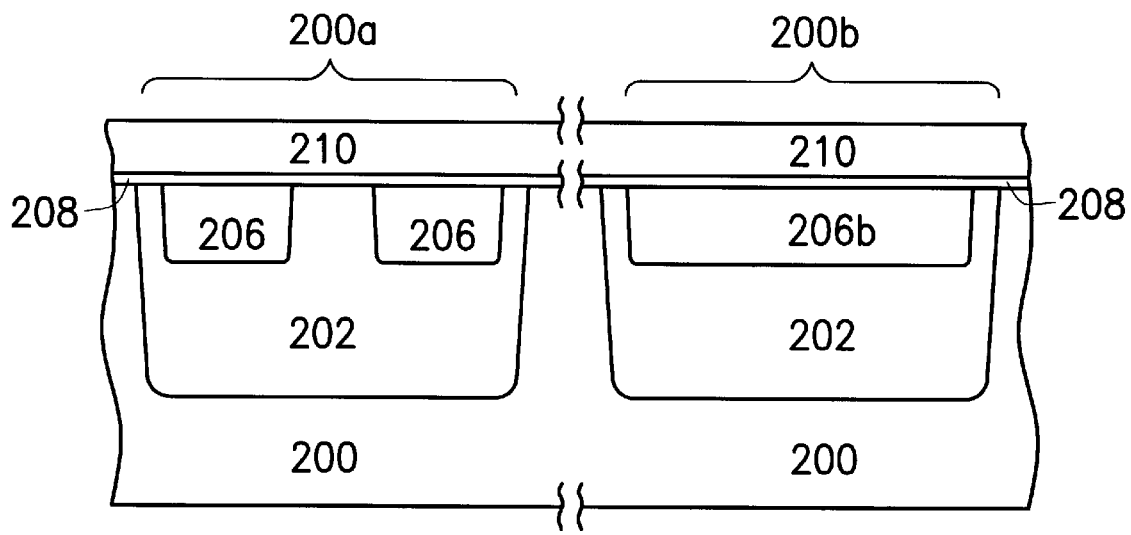

In FIG. 2C, the oxide layer 204 of FIG. 2A is removed by, for example, etching. A pad oxide layer 208 is formed over the substrate 200 by, for example, thermal oxidation. A silicon nitride layer 210 is formed on the pad oxide layer 208 by, for example, low pressure chemical vapor deposition (LPCVD).

Figure 2D:
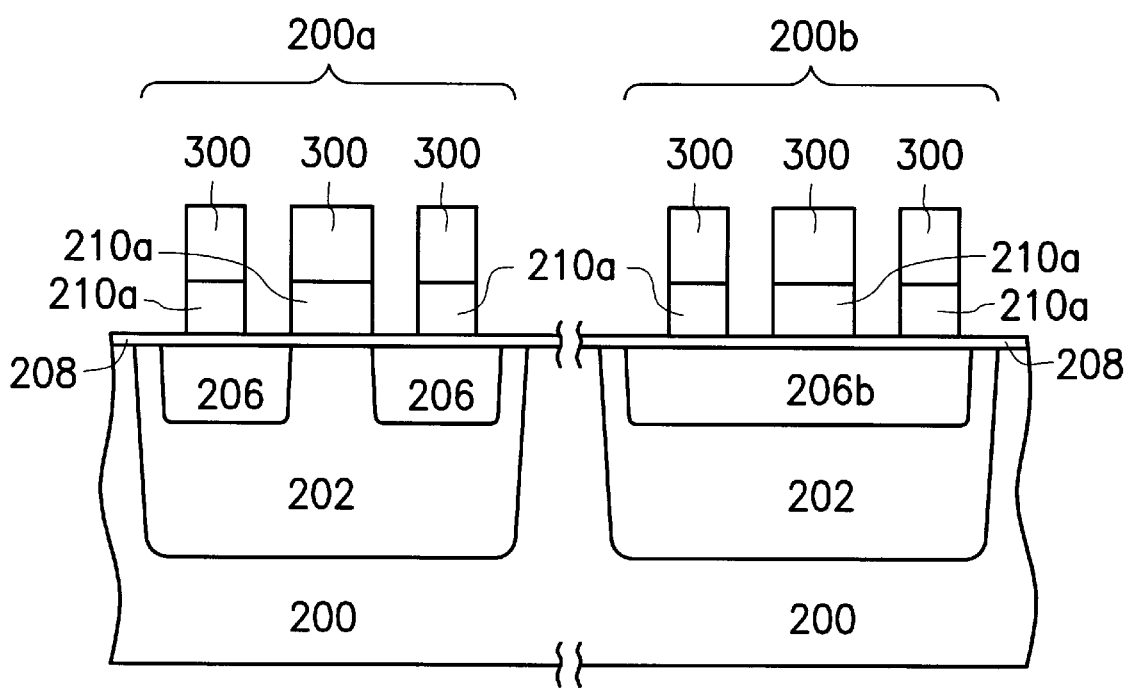

In FIG. 2D, a photoresist layer 300 with a desired pattern is formed on the silicon nitride 210. The silicon nitride layer 210 of FIG. 2C is etched and becomes a silicon nitride layer 210a at the high-bias region 200a and the low-bias region 200b. A portion of the pad oxide layer 208 is exposed. An exposed portion of the pad oxide layer 208 is to be used to form a field oxide layer. An unexposed portion of the pad oxide layer 208 is to be used to form a gate, an interchangeable source/drain, and other doped active regions.

Figure 2E:
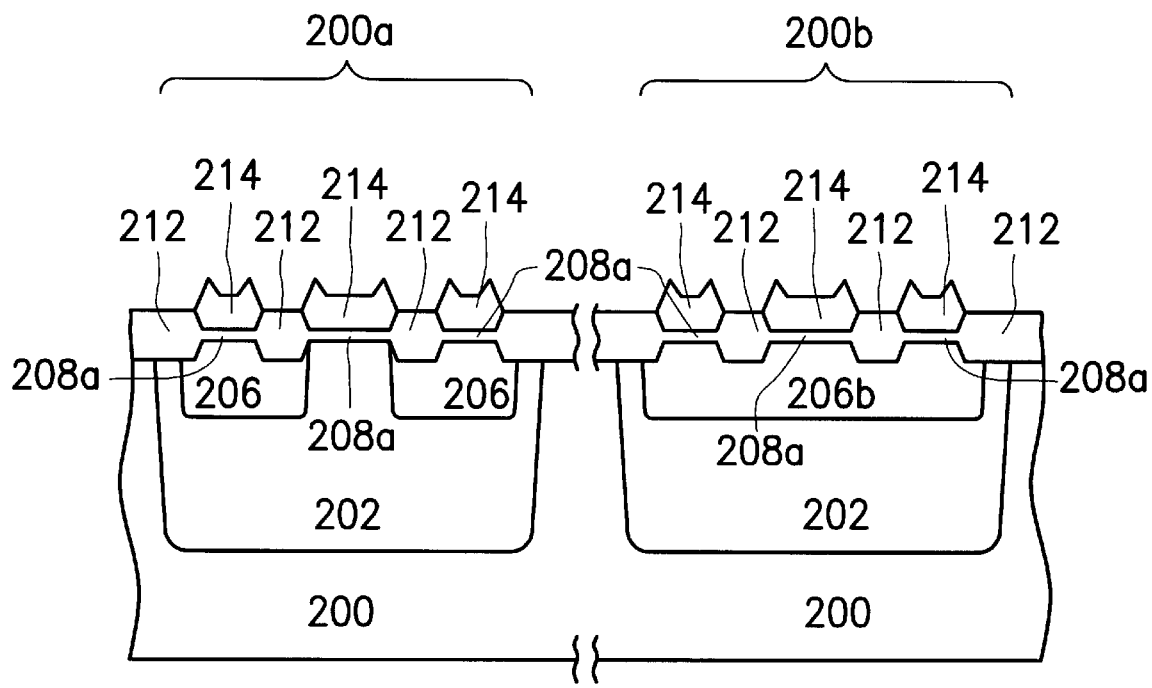

In FIG. 2E, after the photoresist layer 300 is removed, the substrate 200 is put in an oxidation furnace (not shown) to perform, for example, a wet oxidation process, which includes water vapor for an oxidation reaction. A field oxide (FOX) layer 212 is formed on the exposed pad oxide layer 208 of FIG. 2D. Since the silicon nitride layer 210 of FIG. 2D does not absorb water vapor, the unexposed portion of the pad oxide layer 208 forms a pad oxide layer 208a and is not oxidized but water vapor can enter from the edge of the silicon nitride layer 210a to cause a bird's beak structure. The bird's structure is typical phenomenon particularly in a formation of FOX layer. The silicon nitride layer 210a becomes a silicon nitride layer 214.

Figure 2F:
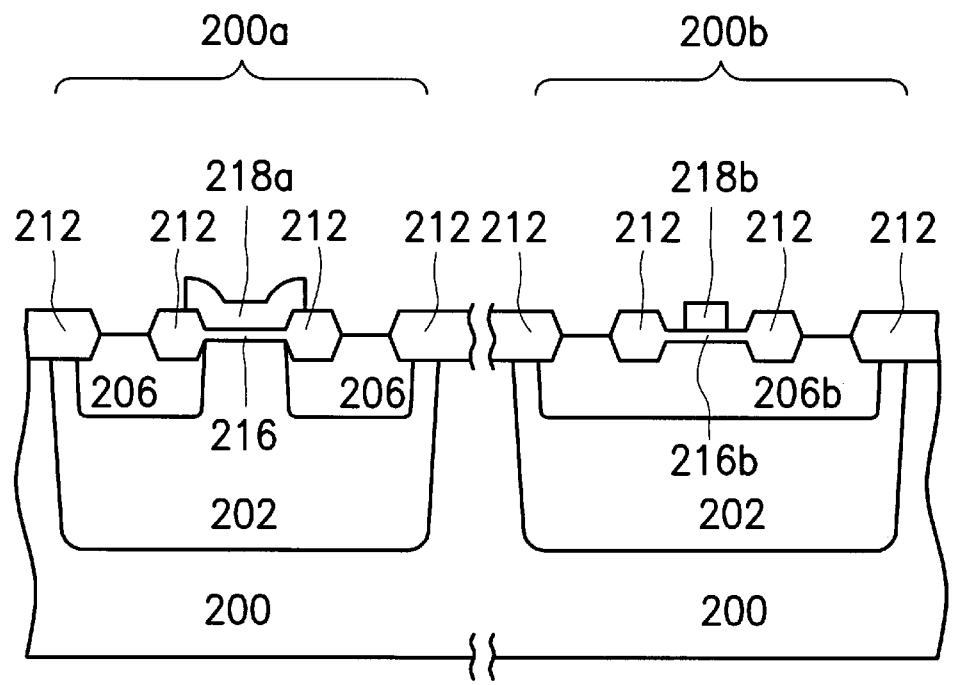

In FIG. 2F, the silicon nitride layer 214 is removed by, for example, wet etching. The pad oxide layer 208a is also removed by, for example, wet etching so that a portion of the doped wells 206, 206b, 202 in the substrate 200 is exposed. A dry oxidation is, for example, performed to form a gate oxide layers 216, 216b with a better quality. The gate oxide layer 216 at the high-bias region 200a is formed on the well 202 between the wells 206. The gate oxide layer 216b at the low-bias region 200b is formed on the well 206b between two substructures of the FOX layer 212. A polysilicon layer (not shown) is form over the substrate 200 and is patterned to form a gate 218a on the gate oxide layer 216 at the high-bias region 200a, and a gate 218b on the gate oxide layer 216b at the low-bias region 200b. The gate 218a fully covers the gate oxide layer 216 and a portion of the abutting FOX layer 212. The gate 218b covers a middle portion of the gate oxide layer 216b so as to leave an exposed portion of the gate oxide layer 216b on each side of the gate 218b.

Figure 2G:
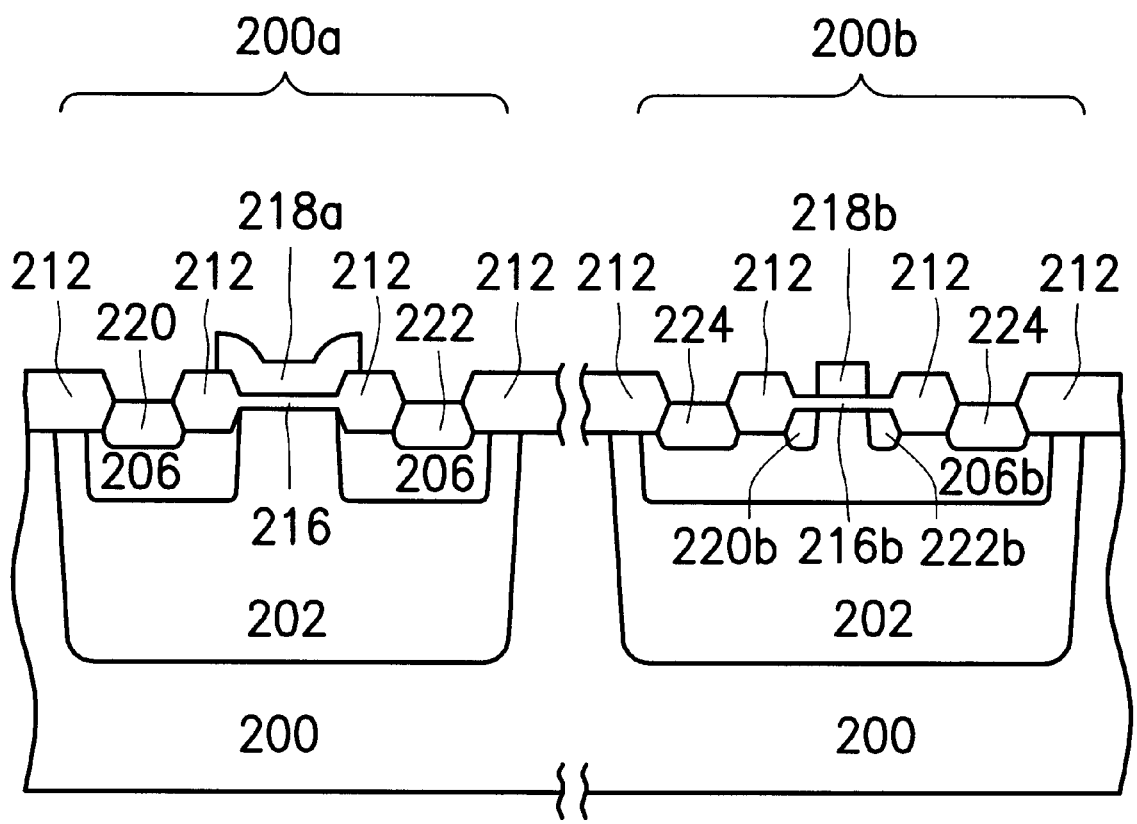

In FIG. 2G, an ion implantation process is performed to doped the substrate 200 at the region other than the FOX layer 212 and the gates 218a, 218b. The FOX layer 212 and the gates 218a, 218b serve as a mask. At the high-bias region 200a, a source region 220 is formed in one of the wells 206, and a drain region 222 is formed in the other one of the wells 206. At the low-bias region 200b, a doped region 224 is formed at the exposed region of the well 206b. A source region 220b and a drain region 222b are separately formed under the exposed portion of the gate oxide layer 216b on each side of the gate 218b.

Figure 1A:
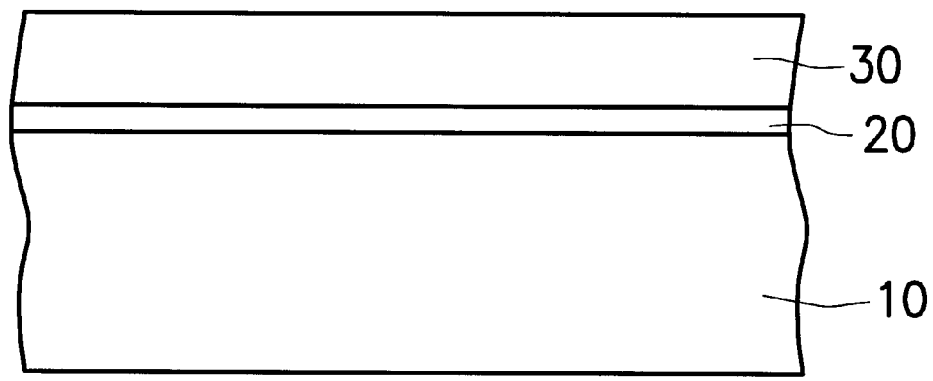
FIGS. 1A–1D are cross-sectional views of a high-bias semiconductor device schematically illustrating a conventional fabrication process for the high-bias semiconductor device.
Figure 1B:
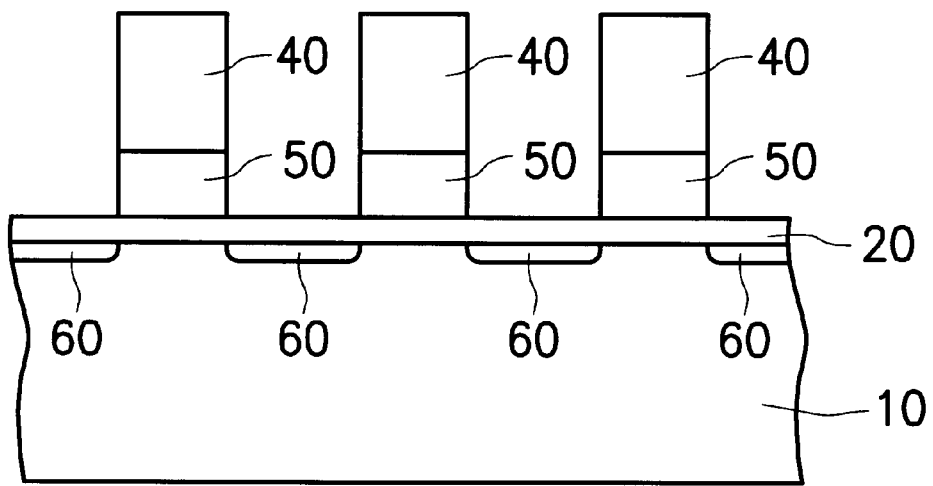
Figure 1C:
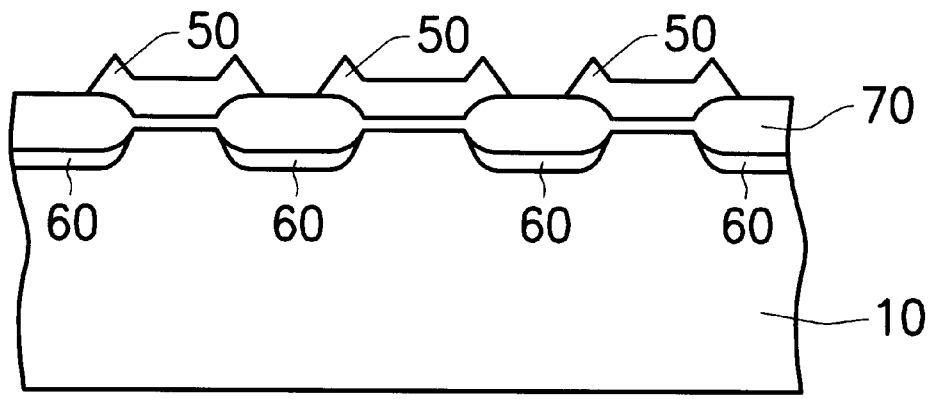
Figure 1D:
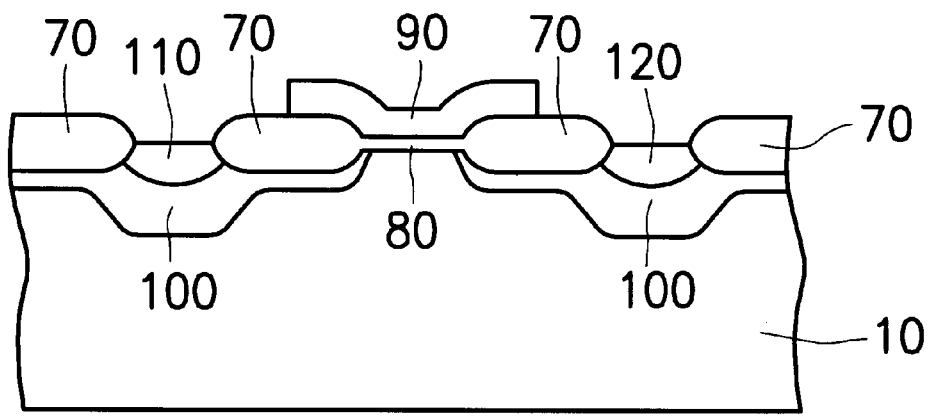

The high-bias MOS transistor including the gate 218a, the gate oxide layer 216, portion of the FOX layer 212, the wells 206, the source region 220, and the drain region 222 is formed. The wells 206 serves a drift region like the purpose of the drift region 100 of FIG. 1D in the conventional fabrication method. The low-bias MOS transistor including the gate 218b, the gate oxide layer 216b, the source 220b, and the drain 222b is formed on the well 206b. The high-bias MOS transistor and the low-bias MOS transistor are just for an example of semiconductor devices. The high-bias MOS transistor can generally include a high-bias semiconductor device, and the low-bias MOS transistor can generally include a low-bias semiconductor device.

In conclusion, the method of the invention includes using the doped well 206 as a drift region of the high-bias device so that the drift region can be formed simultaneously when a well for a low-bias device is formed. At this stage, one fabrication of photomask is saved. The method of the invention also fabricates the high-bias device and the low-bias device simultaneously, using a commonly used photomask. The ion implantation processes are simultaneously performed on the high-bias device and the low-bias device. There is no need of some extra fabrication of photomasks separately used for forming the high-bias device and the low-bias device. The ion implantation processes are also globally performed to doped desired junction regions and wells of the high-bias device and the low-bias device. Moreover, the high-bias device of the invention can produce various high biases to drive various IC devices, which need high bias. This is achieved since the wells 206, 202 used in the high-bias device can be doped with desired dopants to produce a desired conductivity so as to produce a desired high bias.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a high-bias device which is compatibly fabricated with a low-bias device, the method comprising:

providing a substrate doped with a first-type dopant, wherein the substrate comprises a high-bias region and a low-bias region;

forming an oxide layer over the substrate;

forming a first well doped with a second-type dopant in the substrate, wherein the first well further comprises a high-bias well at the high-bias region and a low-bias well at the low-bias region, and the second-type dopant is different from the first-type dopant;

simultaneously forming at least two second wells in the high-bias well and a third well in the low-bias well, wherein a first-type dopant is doped in the second wells and the third well;

removing the oxide layer and forming a pad oxide layer over the substrate;

forming a silicon nitride layer on the pad oxide layer;

patterning the silicon nitride layer to form a plurality of exposed portions of the pad oxide layer at the high-bias region and the low-bias region;

forming a plurality of field oxide (FOX) layers on the exposed portions of the pad oxide layer;

removing the silicon nitride layer;

removing the pad oxide layer;

simultaneously forming a first gate oxide layer on the high-bias well between the second wells, and a second gate oxide layer on the third well between two of the FOX layers within the third well;

simultaneously forming a first gate on the first gate oxide layer, and a second gate on the second gate oxide layer, wherein the first gate fully covers the first gate oxide layer and the second gate covers the second gate oxide layer at about the middle region; and simultaneously forming a first source region and a first drain region separately in the second wells, a second source region and a second drain region below the second gate oxide layer in the third well at each side of the second gate, and a plurality of variously doped regions in the substrate;

wherein if the first-type dopant is an N-type dopant then the second-type dopant is a P-type dopant, and if the first-type dopant is a P-type dopant then the second-type dopant is an N-type dopant.

2. The method of claim 1, wherein the N-type dopant comprises phosphorus.

3. The method of claim 1, wherein the N-type dopant comprises arsenic.

4. The method of claim 1, wherein the P-type dopant comprises boron.

5. The method of claim 1, wherein the P-type dopant comprises gallium.

6. The method of claim 1, wherein the step of forming the first well comprises photolithography and ion implantation.

7. The method of claim 1, wherein the step of simultaneously forming the second wells in the high-bias well and the third well in the low-bias well comprises photolithography and ion implantation.

8. The method of claim 1, wherein the step of forming the first well comprises a driving-in process.

9. The method of claim 8, wherein the step of forming the first well comprises a thermal process.

10. The method of claim 1, wherein the step of simultaneously forming the second wells in the high-bias well and the third well in the low-bias well comprises a driving-in process.

11. The method of claim 1, wherein the step of removing the oxide layer and forming the pad oxide layer comprises an etching process to remove the oxide layer.

12. The method of claim 1, wherein the step of removing the oxide layer and forming the pad oxide layer comprises a thermal process to form the pad oxide layer.

13. The method of claim 1, wherein the step of forming the silicon nitride layer comprises low pressure chemical vapor deposition (LPCVD).

14. The method of claim 1, wherein the step of forming the FOX layers comprises a wet oxidation process.

15. The method of claim 1, wherein the step of removing the pad oxide layer comprises wet etching.

16. The method of claim 1, wherein the step of removing the silicon nitride layer comprises wet etching.

17. The method of claim 1, wherein the step of simultaneously forming a first source region and a first drain region separately in the second wells comprises an ion implantation process.

18. The method of claim 17, wherein in the step of simultaneously forming a first source region and a first drain region separately in the second wells, the by using first gate, the second gate, and the FOX layers as an ion implantation mask.

* * * * *